United States Patent
Moerder et al.

(10) Patent No.: US 6,256,483 B1
(45) Date of Patent: Jul. 3, 2001

(54) METHOD AND APPARATUS FOR CALIBRATION OF A WIRELESS TRANSMITTER

(75) Inventors: Karl E. Moerder, Poway; Donald W. Becker, Rancho Santa Fe, both of CA (US)

(73) Assignee: Tachyon, Inc., San Diego, CA (US)

( * ) Notice: Subject to any disclaimer, the term of this patent is extended or adjusted under 35 U.S.C. 154(b) by 0 days.

(21) Appl. No.: 09/407,641

(22) Filed: Sep. 28, 1999

Related U.S. Application Data

(60) Provisional application No. 60/105,953, filed on Oct. 28, 1998.

(51) Int. Cl.$^7$ ..................................... H04B 17/00
(52) U.S. Cl. ........................ 455/115; 455/69; 455/116; 455/126; 455/127; 330/279
(58) Field of Search ..................... 455/115, 116, 455/126, 127, 69, 63, 522; 330/144, 284, 279

(56) References Cited

U.S. PATENT DOCUMENTS

| | | |
|---|---|---|
| 3,611,435 | 10/1971 | Cooper . |
| 3,818,453 | 6/1974 | Schmidt et al. . |
| 4,543,574 | 9/1985 | Takagi et al. . |
| 4,545,061 | 10/1985 | Hileman . |
| 4,555,782 | 11/1985 | Alaria et al. . |
| 4,736,371 | 4/1988 | Tejima et al. . |
| 4,763,325 | 8/1988 | Wolfe et al. . |
| 4,774,707 | 9/1988 | Raychaudhuri . |
| 4,811,200 | 3/1989 | Wagner et al. . |
| 4,837,786 | 6/1989 | Gurantz et al. . |
| 4,841,527 | 6/1989 | Raychaudhuri et al. . |
| 4,868,795 | 9/1989 | McDavid et al. . |
| 5,012,469 | 4/1991 | Sardana . |
| 5,121,387 | 6/1992 | Gerhardt et al. . |
| 5,159,592 | 10/1992 | Perkins . |

(List continued on next page.)

FOREIGN PATENT DOCUMENTS

| | | |
|---|---|---|
| 0 026 603 | 4/1981 | (EP) . |
| 0 097 309 | 1/1984 | (EP) . |
| 0 473 299 A2 | 3/1992 | (EP) . |
| 0 584 820 A1 | 3/1994 | (EP) . |
| 0 722 228 A2 | 7/1996 | (EP) . |
| 0 755 164 A2 | 1/1997 | (EP) . |
| 0735 690 A3 | 1/1997 | (EP) . |
| 0 889 660 A2 | 1/1999 | (EP) . |
| 0 889 664 A2 | 1/1999 | (EP) . |
| 0 901 253 A2 | 3/1999 | (EP) . |
| 0 912 015 A2 | 4/1999 | (EP) . |
| 0 912 016 A2 | 4/1999 | (EP) . |
| 0 913 968 A1 | 5/1999 | (EP) . |
| 0 913 970 A1 | 5/1999 | (EP) . |
| 0 915 592 A1 | 5/1999 | (EP) . |
| 0 917 317 A1 | 5/1999 | (EP) . |
| 0 920 226 A2 | 6/1999 | (EP) . |
| 0 923 266 | 6/1999 | (EP) . |
| WO 86/07216 | 12/1986 | (WO) . |
| 94/19530 | 9/1994 | (WO) . |

(List continued on next page.)

Primary Examiner—Lee Nguyen
(74) Attorney, Agent, or Firm—Knobbe, Martens, Olson & Bear, LLP

(57) ABSTRACT

When an installed wireless remote unit is operating in the field, routine operation is interrupted to enter a calibration mode. In calibration mode, the compression point of a circuit element is determined by applying a series of different drive levels to the circuit element. Based upon the determination of the compression point, a maximum transmission point is selected for the remote unit. Upon resumption of normal operation, the remote unit uses the maximum transmission point to limit the signal power level transmitted over the wireless link. As time passes or operating conditions change, the calibration process is re-executed.

10 Claims, 10 Drawing Sheets

U.S. PATENT DOCUMENTS

| | | |
|---|---|---|
| 5,166,929 | 11/1992 | Lo . |
| 5,172,375 | 12/1992 | Kou . |
| 5,216,427 | 6/1993 | Yan et al. . |
| 5,239,677 | 8/1993 | Jasinski . |
| 5,276,703 | 1/1994 | Budin et al. . |
| 5,297,144 | 3/1994 | Gilbert et al. . |
| 5,345,583 | 9/1994 | Davis . |
| 5,381,443 | 1/1995 | Borth et al. . |
| 5,384,777 | 1/1995 | Ahmadi et al. . |
| 5,420,864 | 5/1995 | Dahlin et al. . |
| 5,471,473 | 11/1995 | Tejima . |
| 5,485,464 | 1/1996 | Strodbeck et al. . |
| 5,490,087 | 2/1996 | Redden et al. . |
| 5,537,397 | 7/1996 | Abramson . |
| 5,539,730 | 7/1996 | Dent . |
| 5,541,924 | 7/1996 | Tran et al. . |
| 5,550,992 | 8/1996 | Hashimoto . |
| 5,566,168 | 10/1996 | Dent . |
| 5,570,355 | 10/1996 | Dail et al. . |
| 5,577,024 | 11/1996 | Malkamaki et al. . |
| 5,586,121 | 12/1996 | Moura et al. . |
| 5,612,703 | 3/1997 | Mallinckrodt . |
| 5,613,195 | 3/1997 | Ooi . |
| 5,615,212 | 3/1997 | Ruszczyk et al. . |
| 5,638,361 | 6/1997 | Ohlson et al. . |
| 5,642,354 | 6/1997 | Spear . |
| 5,644,576 | 7/1997 | Bauchot et al. . |
| 5,651,009 | 7/1997 | Perreault et al. . |
| 5,652,892 | 7/1997 | Ugajin . |
| 5,673,322 | 9/1997 | Pepe et al. . |
| 5,677,909 | 10/1997 | Heide . |
| 5,678,208 | 10/1997 | Kowalewski et al. . |
| 5,696,903 | 12/1997 | Mahany . |
| 5,704,038 | 12/1997 | Mueller et al. . |
| 5,706,278 | 1/1998 | Robillard et al. . |
| 5,732,328 | 3/1998 | Mitra et al. . |
| 5,734,833 | 3/1998 | Chiu et al. . |
| 5,745,485 | 4/1998 | Abramson . |
| 5,758,088 | 5/1998 | Bezaire et al. . |
| 5,768,254 | 6/1998 | Papadopoulos et al. . |
| 5,790,533 | 8/1998 | Burke et al. . |
| 5,790,535 | 8/1998 | Kou . |
| 5,790,551 | 8/1998 | Chan . |
| 5,790,939 | 8/1998 | Malcolm et al. . |
| 5,790,940 | 8/1998 | Laborde et al. . |
| 5,796,726 | 8/1998 | Hassan et al. . |
| 5,802,061 | 9/1998 | Agrawal . |
| 5,809,093 | 9/1998 | Cooper . |
| 5,809,400 | 9/1998 | Abramsky et al. . |
| 5,809,414 | 9/1998 | Coverdale et al. . |
| 5,815,652 | 9/1998 | Ote et al. . |
| 5,815,798 | 9/1998 | Bhagalia et al. . |
| 5,818,831 | 10/1998 | Otonari . |
| 5,818,845 | 10/1998 | Moura et al. . |
| 5,818,887 | 10/1998 | Sexton et al. . |
| 5,822,311 | 10/1998 | Hassan et al. . |
| 5,828,655 | 10/1998 | Moura et al. . |
| 5,848,064 | 12/1998 | Cowan . |
| 5,859,852 | 1/1999 | Moura et al. . |
| 5,862,452 | 1/1999 | Cudak et al. . |
| 5,872,820 | 2/1999 | Upadrasta . |
| 5,889,766 | 3/1999 | Ohnishi et al. . |
| 5,905,719 | 5/1999 | Arnold et al. . |
| 5,909,447 | 6/1999 | Cox et al. . |
| 5,910,945 | 6/1999 | Garrison et al. . |
| 5,915,207 | 6/1999 | Dao et al. . |
| 5,926,458 | 7/1999 | Yin . |
| 5,940,025 * | 8/1999 | Koehnke et al. ............... 342/159 |
| 5,946,602 | 8/1999 | Sayegh . |
| 5,958,018 | 8/1999 | Eng et al. . |
| 5,959,982 | 9/1999 | Federkins et al. . |
| 5,960,001 | 9/1999 | Shaffer et al. . |
| 5,963,557 | 10/1999 | Eng . |
| 5,966,412 | 10/1999 | Ramaswamy . |
| 5,966,636 | 10/1999 | Corrigan et al. . |

FOREIGN PATENT DOCUMENTS

| | | |
|---|---|---|
| 95/34153 | 12/1995 | (WO) . |
| 96/05690 | 2/1996 | (WO) . |
| 96/11535 | 4/1996 | (WO) . |
| WO 96/33555 | 10/1996 | (WO) . |
| 97/11566 | 3/1997 | (WO) . |
| 07/38502 | 10/1997 | (WO) . |
| 97/37457 | 10/1997 | (WO) . |
| 97/47158 | 12/1997 | (WO) . |
| 97/50249 | 12/1997 | (WO) . |
| 98/12829 | 3/1998 | (WO) . |
| 98/12833 | 3/1998 | (WO) . |
| 98/16046 | 4/1998 | (WO) . |
| 98/19466 | 5/1998 | (WO) . |
| 98/20724 | 5/1998 | (WO) . |
| 98/23112 | 5/1998 | (WO) . |
| 98/24250 | 6/1998 | (WO) . |
| 98/37669 | 8/1998 | (WO) . |
| 98/37706 | 8/1998 | (WO) . |
| 98/44747 | 10/1998 | (WO) . |
| 98/47236 | 10/1998 | (WO) . |
| 98/49625 | 11/1998 | (WO) . |
| 98/54858 | 12/1998 | (WO) . |
| 98/54859 | 12/1998 | (WO) . |
| 99/04338 | 1/1999 | (WO) . |
| 99/04508 | 1/1999 | (WO) . |
| 99/04509 | 1/1999 | (WO) . |
| 99/04521 | 1/1999 | (WO) . |
| 99/05828 | 2/1999 | (WO) . |
| 99/13616 | 3/1999 | (WO) . |
| 99/14963 | 3/1999 | (WO) . |
| 99/16201 | 4/1999 | (WO) . |
| 99/19996 | 4/1999 | (WO) . |
| 99/19999 | 4/1999 | (WO) . |
| 99/21287 | 4/1999 | (WO) . |
| 99/21291 | 4/1999 | (WO) . |
| 99/21296 | 4/1999 | (WO) . |
| 99/21328 | 4/1999 | (WO) . |
| 99/21329 | 4/1999 | (WO) . |
| 99/21378 | 4/1999 | (WO) . |
| 99/21381 | 4/1999 | (WO) . |
| WO 99/21291 | 4/1999 | (WO) . |
| WO 99/21378 | 4/1999 | (WO) . |
| 99/22500 | 6/1999 | (WO) . |
| 99/39480 | 8/1999 | (WO) . |

* cited by examiner

METHOD AND APPARATUS FOR CALIBRATION OF A WIRELESS TRANSMITTER

RELATED APPLICATIONS

The present application claims priority to copending provisional application having the same title, application Ser. No. 60/105,953, filed Oct. 28, 1998, which is hereby incorporated by reference.

BACKGROUND OF THE INVENTION

I. Field of the Invention

This invention relates generally to wireless transmitters. More specifically, the invention relates to power control in a wireless transmitter.

II. Description of the Related Art

The use of wireless communication systems for the transmission of digital data is becoming more and more pervasive. In a wireless system, the most precious resource in terms of cost and availability is typically the wireless link itself. Therefore, one major design goal in designing a communication system comprising a wireless link is to efficiently use the wireless link.

In a system in which multiple units compete for finite system resources, in order for multiple remote units to access common system resources, the wireless link is divided into a series of channels. Channelization can be achieved by one of a variety of well-known techniques such as time division multiple access (TDMA), code division multiple access (CDMA), frequency division multiple access (FDMA) or a combination of these. Each of these channelization techniques, to some extent, limits the frequency bandwidth of the signal transmitted from the remote unit.

In addition, each of these channelization techniques requires the use of power control to some extent to determine the power level at which the remote unit transmits. If the remote unit signal arrives at the hub station at a signal level that is too low, the system performance level may be inadequate to support communication due to excessive errors caused by thermal noise and interference. If the remote unit signal arrives at the hub station at a signal level that is too high, the remote unit generates unnecessary interference to other system users.

FIG. 1 is a schematic diagram illustrating a wireless satellite communication system. A hub station 10 provides digital data transfer capabilities to a plurality of remote units such as a remote unit 14. The hub station sends signals over an uplink forward channel 20 to a satellite 12. The satellite 12 repeats the signal and transmits it over a downlink forward channel 22. The remote unit 14 receives the signal and processes it. The remote unit 14 sends a signal over an uplink reverse channel 24 to the satellite 12. The satellite 12 repeats the signal and forwards it over a downlink reverse channel 26.

A link budget is a design tool used to determine the level at which signals are transmitted offer the system. For example, a link budget is used to determine a nominal level at which the remote unit 14 transmits the reverse link signal over the uplink reverse channel 24 based upon the expected path loss experienced over the uplink reverse channel 24. The satellite 12 may amplify the signal before forwarding it over the downlink reverse channel 26. The link budget estimates the expected path loss of the uplink and downlink reverse channels 24 and 26. In addition, the link budget estimates the expected interference and noise levels introduced by the uplink and downlink reverse channels 24 and 26 as well as noise introduced by the satellite 12 and the hub station 10 such as due to the noise figure of these units. In addition, the link budget estimates the expected variations of these parameters. Using the link budget, a system designer determines a nominal and worst case power level at which the remote unit transmits.

In a communication system which comprises fixed location remote units and which uses a geosynchronous satellite, the path loss of the wireless link channel is fairly consistent overt time. However, weather conditions may vary the path loss to some extent. Depending on the frequency at which the system operates, adverse weather conditions, such as heavy fog, snow, rain or hail, may increase the path loss by several decibels (dB) or more. Therefore, in order to operate efficiently, most wireless systems include a power control loop to control the level at which signals are transmitted and received in the system. For example, the hub station 10 monitors the signal-to-noise ratio of a signal received from the remote unit 14 over the reverse link channels 24 and 26 and notifies the remote unit 14 if the signal-to-noise ratio of the signal falls below a predetermined level. In response, the remote unit 14 increases the power level at which it is transmitting. If the hub station 10 determines that the path loss has decreased, the hub station notifies the remote unit 14 over the forward link channels 20 and 22 and the remote unit 14 decreases the level at which it is transmitting.

In order to reduce the distortion of the reverse link signal, the remote unit 14 is typically designed to comprise a class A power amplifier. Class A power amplifiers provide a high degree of linearity over a substantial range of output power. In order to operate linearly, class A amplifiers require substantially more supply power than the power level of the radio frequency (RF) signals which they produce. A class A amplifier draws the same supply power regardless of the output power which it is producing. Therefore, the size and heat dissipation capabilities of a class A power amplifier may be significant, as well as the cost of their operation. Typically, the size of a class A amplifier doubles for each 3 decibels (dB) extra of power which it is capable of producing. In addition, the cost of the power amplifier increases significantly for each 3 dB extra of power capability. Therefore, it is advantageous to use a link budget to determine the maximum power output level which the remote is required to transmit and to limit the capability of the power amplifier based upon the determination.

FIG. 2 is a graph showing the characteristics of a typical class A amplifier. The horizontal axis represents the RF input power level in units of decibels referred to 1 milliwatt (dBm). The vertical axis represents the RF output power level of the amplifier in the same units. The gain of the amplifier illustrated by curve 32 is approximately 54 dB. For example, when the input drive level is −30 dBm, the output power is 24 dBm. As the input level is increased in 1 dB steps, the output level also increases in 1 dB steps as is characteristic of a linear amplifier. However, at some point, the output power stops tracking the input power on a one-to-one basis. For example, data point 36 on curve 32 represents the point at room temperature at which the gain of the amplifier has decreased by approximately 1 dB to 53 dB of gain. At this point, the input to the amplifier is approximately −19.5 dBm and the output is approximately 33.5 dBm. As the input drive level is increased further beyond the 1 dB compression point, the output of the amplifier does not increase significantly above 34 dBm.

The non-linearities introduced by use of a class A amplifier close to and beyond the 1 dB compression point cause distortion in the modulated signal which causes increased interference levels in adjacent channels for the non-constant envelop signals generated by many modem communication systems. FIG. 3 is a spectrum plot showing the distortion caused when a modulated signal is amplified by a power amplifier which has the characteristics shown by curve 32 of FIG. 2. The horizontal axis represents frequency and the vertical axis represents power level relative to the power level of the modulated signal. The horizontal axis is measured in terms of channels. Channel 1 represents the channel in which the remote unit is operating. Channels 2–8 correspond to other channels in the system. The spectrum plot shown in FIG. 3 is a single side-band plot. However, it may be assumed that the spectrum created is relatively symmetric about the left-most axis as shown in FIG. 3.

Curve 40 represents the spectrum output by the power amplifier when the modulated drive level is −30 dBm. Referring again to FIG. 2, one can see that the power amplifier is quite linear in this region. The modulation bandwidth is limited to less than the bandwidth of the first channel. However, the modulated signal introduces some interference to adjacent channels. For example, in channel 2, the interference level generated is at least 35 dB lower than the intended signal level in channel 1. The interference level continues to drop in channels 3–8.

Curve 42 represents the output of the power amplifier when the input power level is −20 dBm. Referring again to FIG. 2, one can see that operating at −20 dBm is approaching operation at the 1 dB compression point and the amplifier has begun to exhibit increased non-linearity. Due to the non-linearities, the interference level generated by the power amplifier in channel 2 has increased by approximately 10 dB. In addition, the interference level generated in channels 3–8 has also increased. Curves 46, 48, 50, 52 and 54 represent the output of the power amplifier when the input power level is −18, −14, −10, 0 and 10 dBm, respectively. As the input power level increases, the non-linearities continue to increase causing a corresponding increase in the interference level in the adjacent channels. Referring again to FIG. 2, it can be seen that increasing the drive level does not significantly increase the output level once the 1 dB compression point has been reached. For these reasons, it is advantageous to limit the input power level such that the amplifier is operated in the linear region.

The response characteristics of a class A amplifier vary as a function of frequency, temperature and aging. For example, curve 30 of FIG. 2 represents the characteristics of the class A amplifier at a relatively high operating temperature. Notice that the 1 dB compression point has fallen to approximately −22 dBm of input power and 31 dBm of output power. Likewise, curve 34 represents the characteristics of the amplifier significantly below room temperature. The 1 dB compression point has increased slightly with comparison to curve 32. Similar curves could be generated to represent the frequency and aging response of the amplifier.

In addition to the variations of an amplifier over time, frequency and aging, each amplifier produced by a common process exhibits different characteristics due to process variations as well as other factors. FIG. 4 is a graph showing typical variations in operating curves of amplifiers constructed from a common process. Curve 32 represents the average performance at room temperature as also shown in FIG. 2. Curve 60 represents a power amplifier which exhibits the one-sigma low side process variation characteristics. Notice that the 1 dB compression point is approximately −23 dBm and that the maximum output power of the amplifier is approximately 2 dB less than shown in curve 32. Also note that the gain of the amplifier represented by curve 60 is lower than shown in curve 32 even in the linear region. The curve 64 represents a power amplifier which exhibits the one-sigma high side process variation. Note that the 1 dB compression point is approximately −19 dBm and that the gain of the amplifier is higher than the other two curves shown even in the linear region.

In order to design a link budget which is sufficient to operate over process variations, temperature variations, frequency variations and aging, the maximum output power must be limited in view of the worse case 1 dB compression point over all of these factors. Therefore, referring again to curve 60 of FIG. 4, according to the prior art, the maximum output power of the system should be limited to approximately 29 dBm in order to accommodate variations over frequency, temperature and aging of the one sigma low, side power amplifier. Thus, even though the majority of power amplifiers are capable of producing 5 dB more than this maximum at room temperature and some of the amplifiers are capable of producing approximately 7 dB more output power at room temperature, under the prior art, each remote unit's output power is limited according to the worse-case scenario.

Typical prior art remote units use a detector to sense the output power level. When the output power level exceeds the predetermined maximum, the detector alerts the remote unit and the level at which the power amplifier is driven is limited to the current drive level. Because the output of the detector itself can vary according to process gains, frequency, temperature and aging, some margin must also be built into the system to accommodate for these variations. Alternatively, complicated detector calibration mechanisms can be incorporated into factory testing in order to account for some of these variations. In general, however, the maximum output power must be further limited in order to accommodate variations in the detector as well. In conjunction with the limitations imposed by the variations in the power amplifiers, these limitations significantly decrease the efficiency with which the average power amplifier is used during routine operation.

Therefore, there has been a long-felt need in the industry to develop an efficient power control mechanism in a wireless transmitter.

SUMMARY OF THE INVENTION

When an installed wireless remote unit is operating in the field, routine operation is interrupted to enter a calibration mode. In calibration mode, the compression point of a circuit element is determined by applying a series of different drive levels to the circuit element. Based upon the determination of the compression point, a maximum transmission point is selected for the remote unit. Upon resumption of normal operation, the remote unit uses the maximum transmission point to limit the signal power level transmitted over the wireless link. As time passes or operating conditions change, the calibration process is re-executed.

BRIEF DESCRIPTION OF THE DRAWINGS

The features, objectives, and advantages of the invention will become more apparent from the detailed description set forth below when taken in conjunction with the drawings wherein like parts are identified with like reference numerals throughout and wherein.

DETAILED DESCRIPTION OF THE INVENTION

Figure 5:
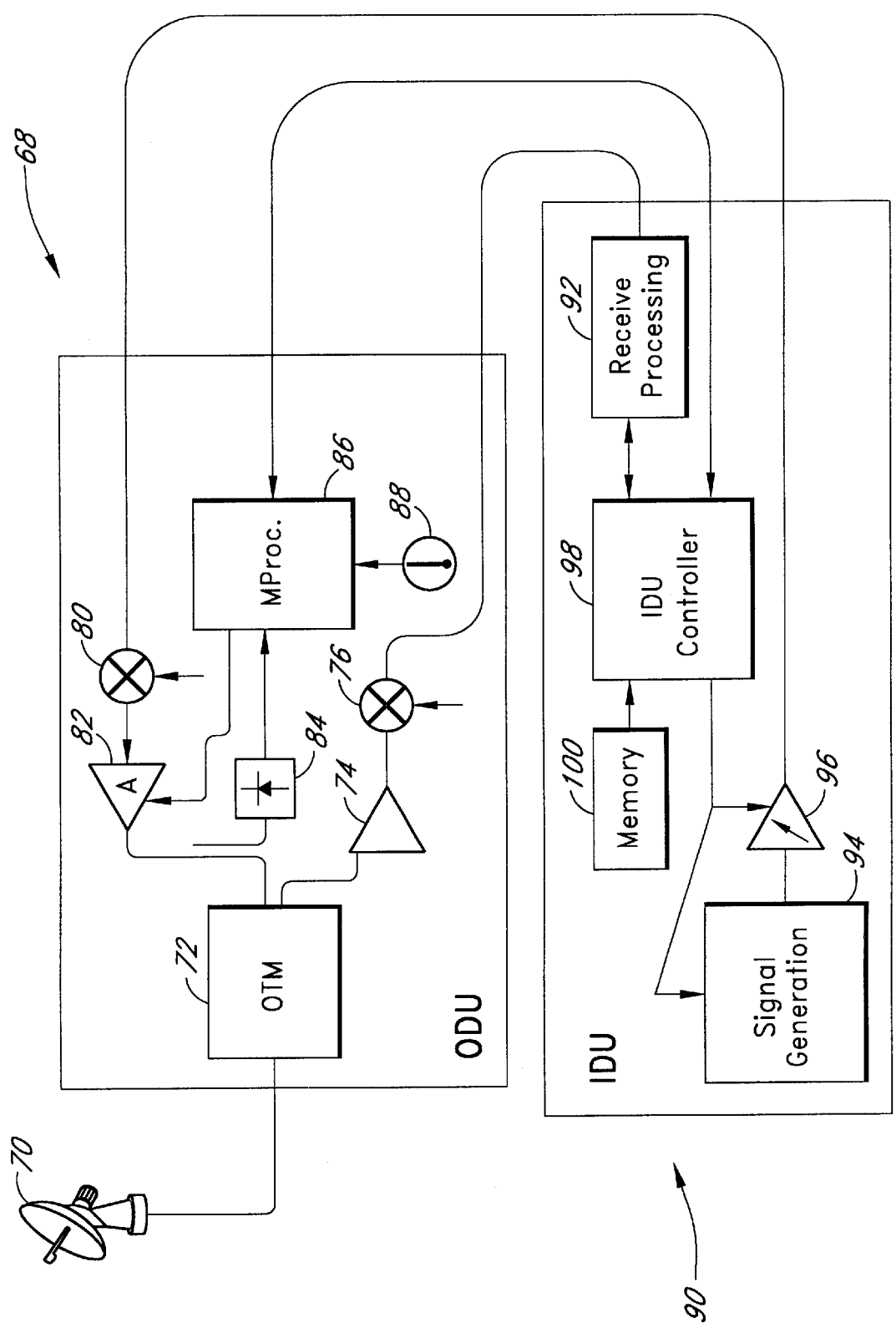
FIG. 5 is a block diagram showing an outdoor unit and an indoor unit of a remote unit in accordance with the invention.

FIG. 5 is a block diagram showing an outdoor unit 68 and an indoor unit 90 of a remote unit in accordance with the invention. A satellite dish 70 is used to transmit and receive signals via a satellite transponder and is directly coupled to the outdoor unit 68.

The outdoor unit 68 comprises circuit elements which are located in close proximity to the satellite dish 70. In one embodiment, the satellite dish 70 is located on the roof of a building and the outdoor unit 68 is mounted directly to the satellite dish 70 assembly on the exterior of the building. The outdoor unit 64 comprises a low noise amplifier 74 which is located in close proximity to the satellite dish 70 in order to reduce the path loss between the satellite dish 70 and the low noise amplifier 74 and to preserve the system noise figure. Likewise, the outdoor unit 68 comprises a power amplifier 82 which is located in close proximity to the satellite dish 70 in order to reduce the path loss between the power amplifier 82 and the satellite dish 70 and avoid increasing the required output of the power amplifier 82.

The indoor unit 90 comprises circuitry which need not be located in close proximity to the satellite dish 70. In one embodiment, the indoor unit is located at a convenient position which allows more ready access by the system administrator. The indoor unit 90 is connected to the outdoor unit 68 by a length of cable.

The division of the communication unit into the outdoor unit 68 and the indoor unit 90 allows them to be separately manufactured and factory tested. For example, the outdoor unit 68 is preferably manufactured by an RF design house. The indoor unit 90 is preferably manufactured by a company which specializes in communications. In one embodiment, the indoor unit 90 is designed to be compatible with a variety of different outdoor units which operate at a variety of different frequencies and which are manufactured by a variety of different vendors. When in place in the field, the outdoor unit and indoor unit can be separately serviced, replaced or upgraded.

Within the outdoor unit 68, the satellite dish 70 is coupled to an orthomode transducer (OMT) 72 or other device or method for providing separation of signals. The OMT 72 couples the receive signals from the satellite dish 70 to the low noise amplifier 74. The OMT 72 also couples transmit signals from the power amplifier 82 to the satellite dish 70. The low noise amplifier 74 is coupled to a mixer 76 which down-converts the received signal to an intermediate frequency. The output of the mixer 76 is coupled to the indoor unit 90 via a length of cable. Within the indoor unit 90, a receive processing unit 92 performs further analog and digital signal processing on the received signal. An indoor unit controller 98 controls the receive processing unit 92 as well as other components of the indoor unit 90.

A signal generation unit 94 is controlled by the indoor unit controller 98 and creates the transmit signal waveform. For example, the signal generation unit 94 receives data from system users and encodes the data for transmission. The signal generation unit 94 also modulates the encoded data, converts the modulated signal to an analog waveform and translates it to an intermediate frequency.

The modulated IF output signal from the signal generation unit 94 is coupled to a variable gain amplifier 96. The gain of the variable gain amplifier 96 is controlled by the indoor unit controller 98. The output IF signal from the variable gain amplifier 96 is passed over a length of cable to the outdoor unit 68. Within the outdoor unit 68, a mixer 80 converts the IF signal to a RF frequency suitable for transmission. For example, in one embodiment, the RF center frequency is within the Ku band, Ka band or any other suitable band. The output of the mixer 80 is input into the power amplifier 82. In the preferred embodiment, the power amplifier 82 is a class A amplifier. When enabled, the power amplifier 82 outputs a high power RF signal to the satellite dish 70 via the OMT 72.

In addition to the transmit and receive path circuitry, the outdoor unit 68 comprises a detector 84, a microprocessor 86 and a temperature sensor 88. The microprocessor 86 is used to control the functions of the outdoor unit 68 and to provide information to the indoor unit controller 98. In the preferred embodiment, the microprocessor 86 is a low functionality part which does not greatly impact the price or size of the outdoor unit 68. In one embodiment, the microprocessor 86 is an AT9054433 from Atmel Corporation of San Jose, Calif. The microprocessor 86 is coupled to the indoor unit controller 98 and responds to commands therefrom. For example, the indoor unit controller 98 can request that the microprocessor 86 identify itself. In response, the microprocessor 86 forwards a unique identification number which uniquely identifies the outdoor unit 68. The identification can include, for example, the manufacturer, model, revision number, and capabilities of the outdoor unit 68.

In one embodiment, the microprocessor 86 comprises a 10-bit analog-to-digital (A/D) converter. The microprocessor 86 is coupled to the temperature sensor 88. In the preferred embodiment, the temperature sensor 88 outputs an analog signal level indicative of the operating temperature of the outdoor unit 86. The microprocessor 86 converts the analog temperature indication to a digital value using the analog-to-digital converter and provides the value to the indoor unit controller 98 upon request therefore.

Figure 6:
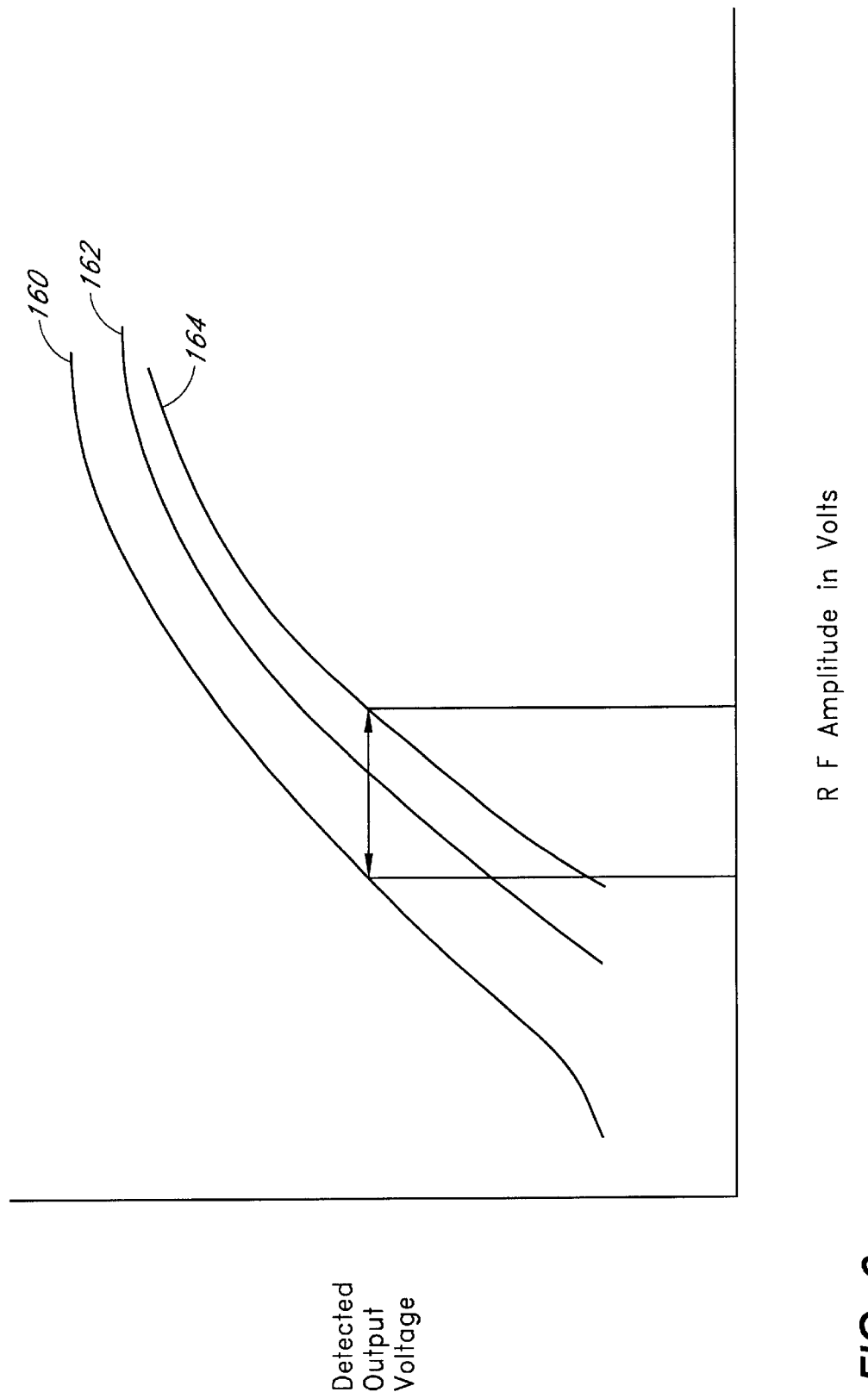
FIG. 6 is a graph showing the characteristics of a typical schottky diode detector with respect to temperature.

The power detector 84 is loosely coupled to the output of the power amplifier 82 such as through a coupler or power splitter. In the preferred embodiment, the power detector 84 is a schottky diode detector (or other detector-type) and outputs an analog signal level indicative of the RF signal power level produced by the power amplifier 82. FIG. 6 is a graph showing the characteristics of a typical schottky diode detector over temperature. The vertical axis of FIG. 6 is the detected output in volts. The horizontal axis is the amplitude of the RF input signal in volts. The curve 160 represents the response of the detector at −20C. The curve 162 represents the response of the detector at 25C. The curve 164 represents the response of the detector at +50C. As can be seen by FIG. 6, the response of the detector is neither linear nor constant over temperature. As shown in the graph, a single output voltage may be mapped to a wide range of input amplitudes depending upon the operating temperature of the detector.

In one embodiment, the microprocessor 86 comprises an onboard oscillator which is used to create a clock by which data is transferred to the indoor unit 90. The onboard oscillator may cause undesirable in-band spurs in the transmit signal when operating. In one embodiment, the on-board oscillator is disabled during normal transmissions and is enabled during the calibration process in order to convert the analog values to digital values. In addition, during periods of idleness, the oscillator is enabled for other functions.

In a system which transfers digital data, remote units tend to generate bursty data. The bursty data is characterized in that it has a high peak-to-average traffic ratio, meaning that large blocks of data are transferred during short periods of time interposed between significantly longer periods of idleness.

Figure 1:
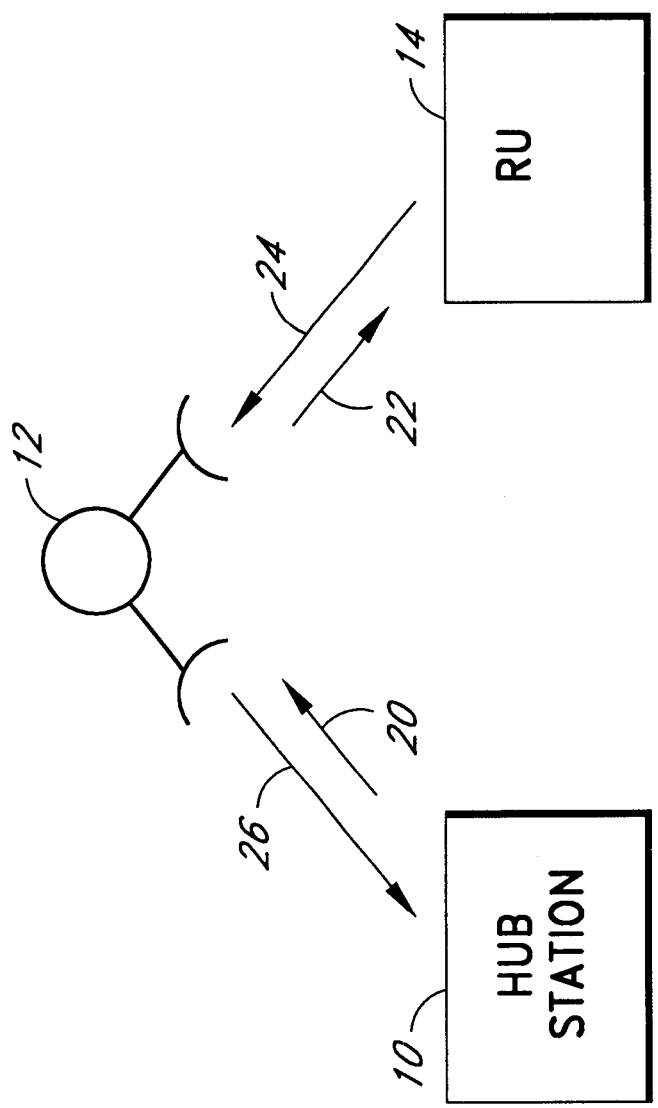
FIG. 1 is a schematic diagram illustrating a wireless satellite communication system.
Figure 2:
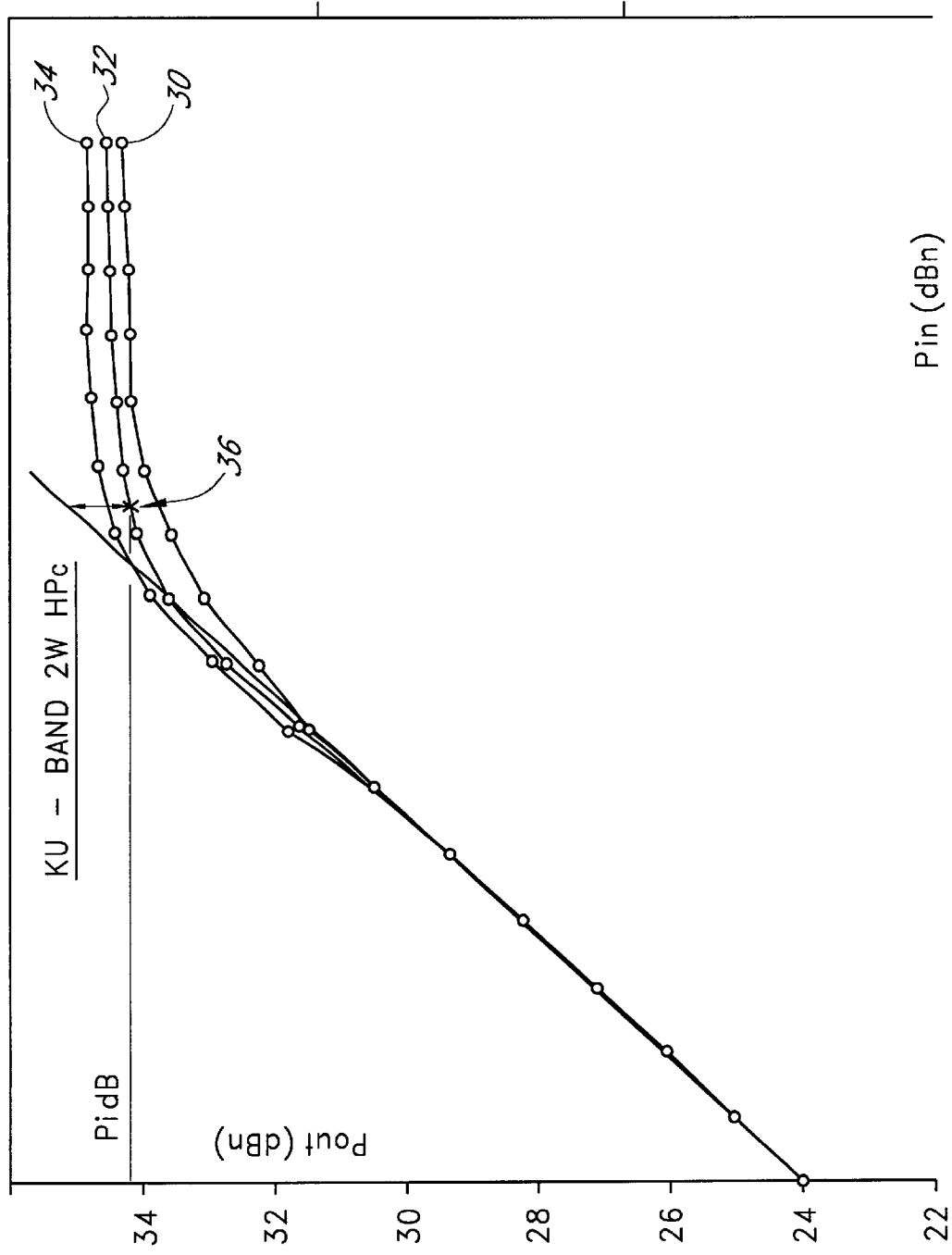
FIG. 2 is a graph showing the characteristics of a typical class A amplifier.
Figure 3:
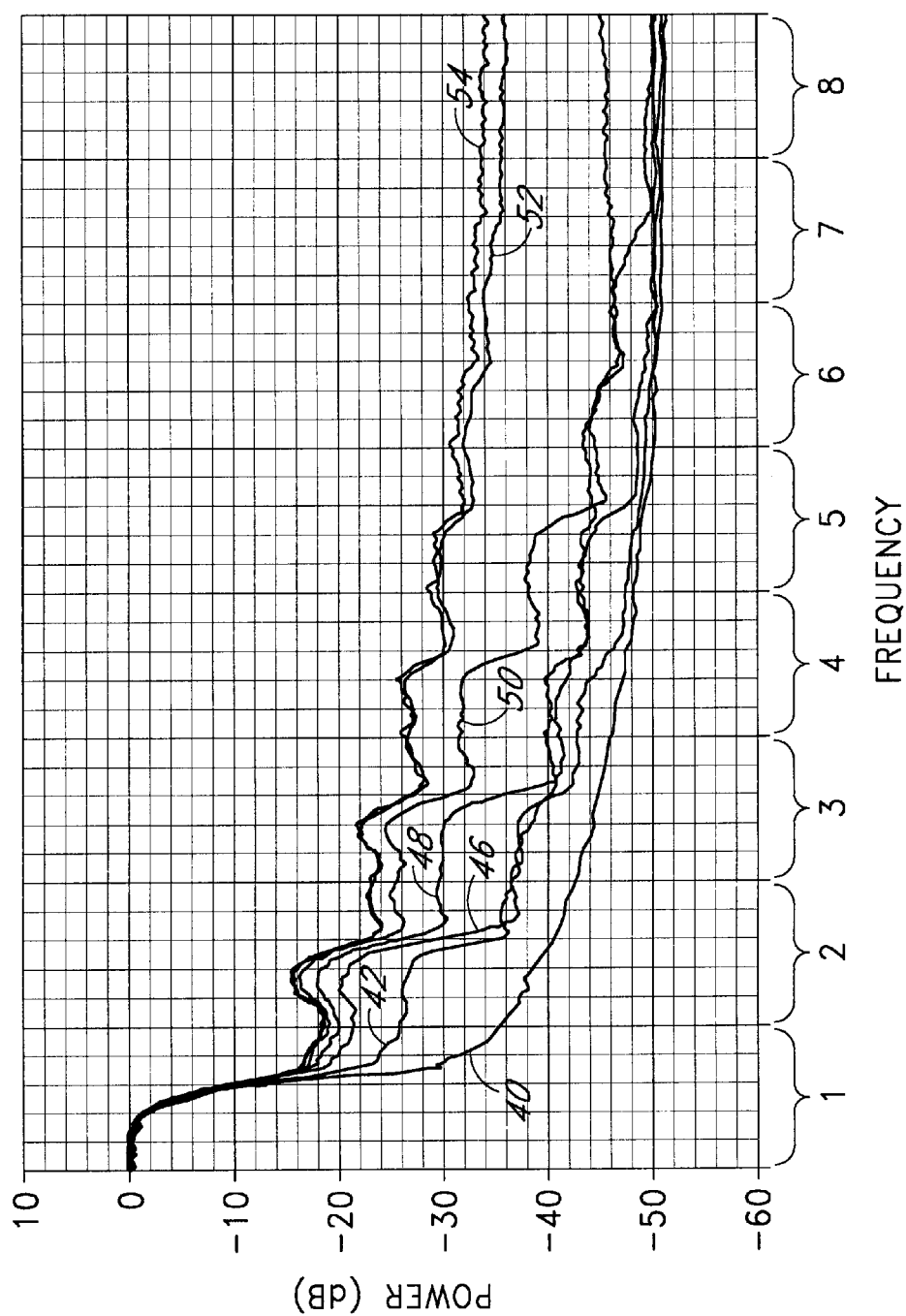
FIG. 3 is a spectrum plot showing the distortion caused when a modulated signal is amplified by a power amplifier which has the characteristics shown by curve 32 of FIG. 2.

Referring back again to FIG. 1, although only one remote unit 14 is shown in FIG. 1, the reverse link resources are shared between a great number of remote units in the preferred embodiment. If the power amplifiers within the plurality of remote units remain active while the remote units are idle, the combined interference caused by the amplified noise from the idle remote units can create a significant amount of interference to the remote units which are currently transmitting. In order to decrease this interference, the power amplifiers in the idle remote units are disabled so that they do not amplify and transmit noise while idle. The microprocessor 86 is coupled to the power amplifier 82 such that it can disable the power amplifier during periods of idleness.

In one embodiment, the outdoor unit 68 has a fixed gain. The output power of the remote unit is varied by varying the input power to the outdoor unit 68. For example, as shown in FIG. 5, the variable gain amplifier 96 sets the output power of the indoor unit 90. In order to limit the interference to other remote units operating in the same system, it is advantageous to limit the power level at which the remote unit transmits its signal. Typically, such systems are implemented using feedback from the hub station. For example, the remote unit initially transmits at a relatively low signal level. Based upon a signal quality at which the reverse link signal reaches the hub station, the hub station sends commands over the forward link channel requesting the remote unit to increase the signal power level. When adverse weather conditions increase the path loss on the reverse link channel, the hub station sends a command over the forward link channel which orders an increase in signal power level transmitted by the remote unit. In response, the indoor unit 90 increases the gain setting of the variable gain amplifier 96.

As noted above, however, it is advantageous to limit the maximum signal power level at which the remote unit transmits so that the power amplifier operates within the linear region in order to avoid creating excess interference to the system. In order to limit the signal power level transmitted from the fixed gain outdoor unit 68, the signal power level produced by the indoor unit 90 must be limited. Therefore, in one embodiment, the indoor unit comprises a memory unit 100 in which is stored a maximum gain setting for the variable gain amplifier 96.

When the hub station sends a command for the remote unit to increase the signal power level at which it is transmitting, the message is received by the remote unit and processed by the receive processing unit 92. The command is forwarded to the indoor unit controller 98. In response, the indoor unit controller 98 increases the gain setting of the variable gain amplifier 96 unless the current gain setting is equal to or exceeds the maximum gain setting stored in the memory unit 100.

As noted above, it is difficult to select a maximum gain setting which allows efficient use of the outdoor unit resources while providing margin to account for part-to-part variations and variations over time, temperature, frequency and aging. The present invention comprises a means for determining the maximum gain setting such that the capabilities of the outdoor unit are fully exercised while avoiding non-linear operation.

Figure 4:
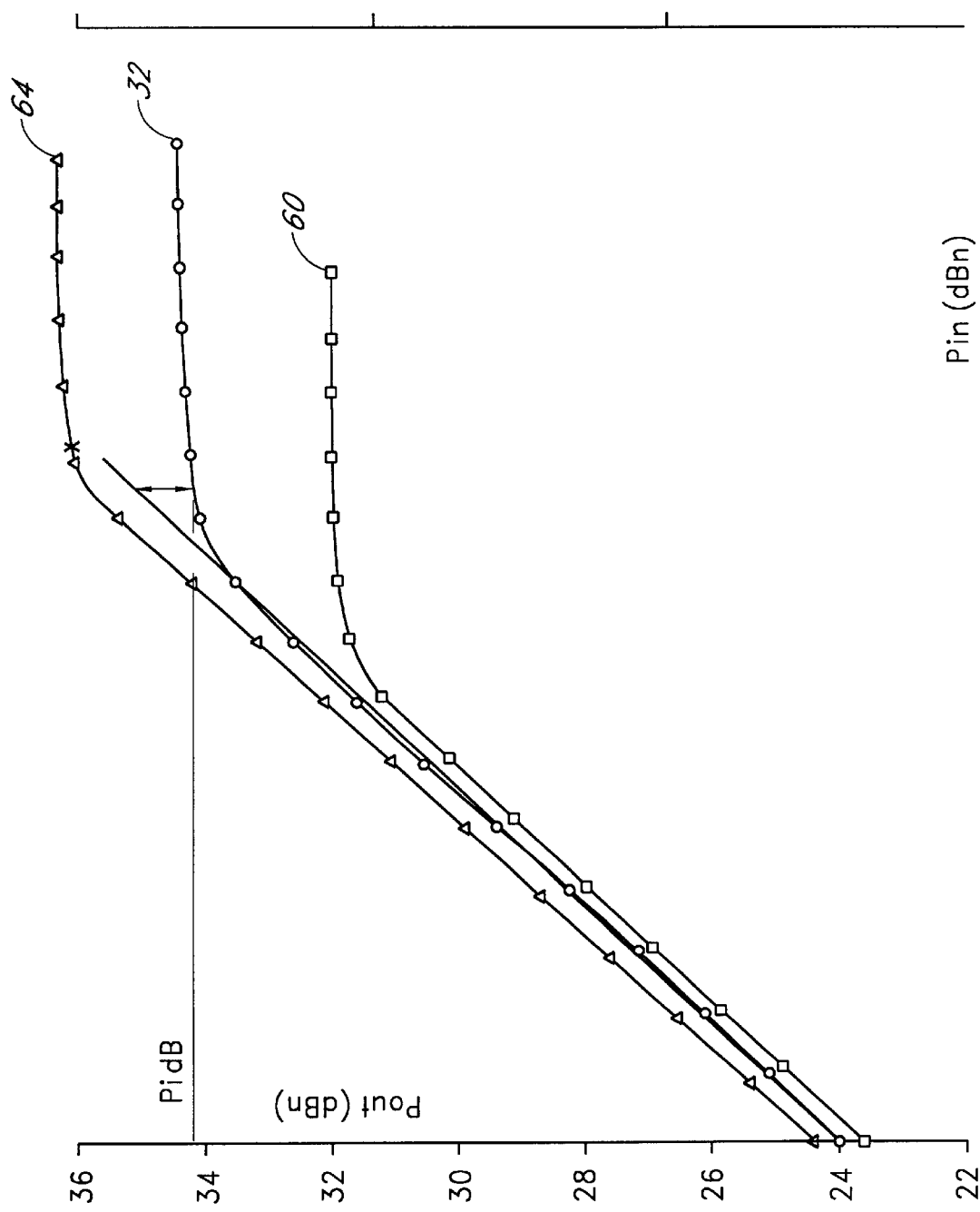
FIG. 4 is a graph showing typical variations of operating curves produced by amplifiers constructed from a common process.
Figure 7:
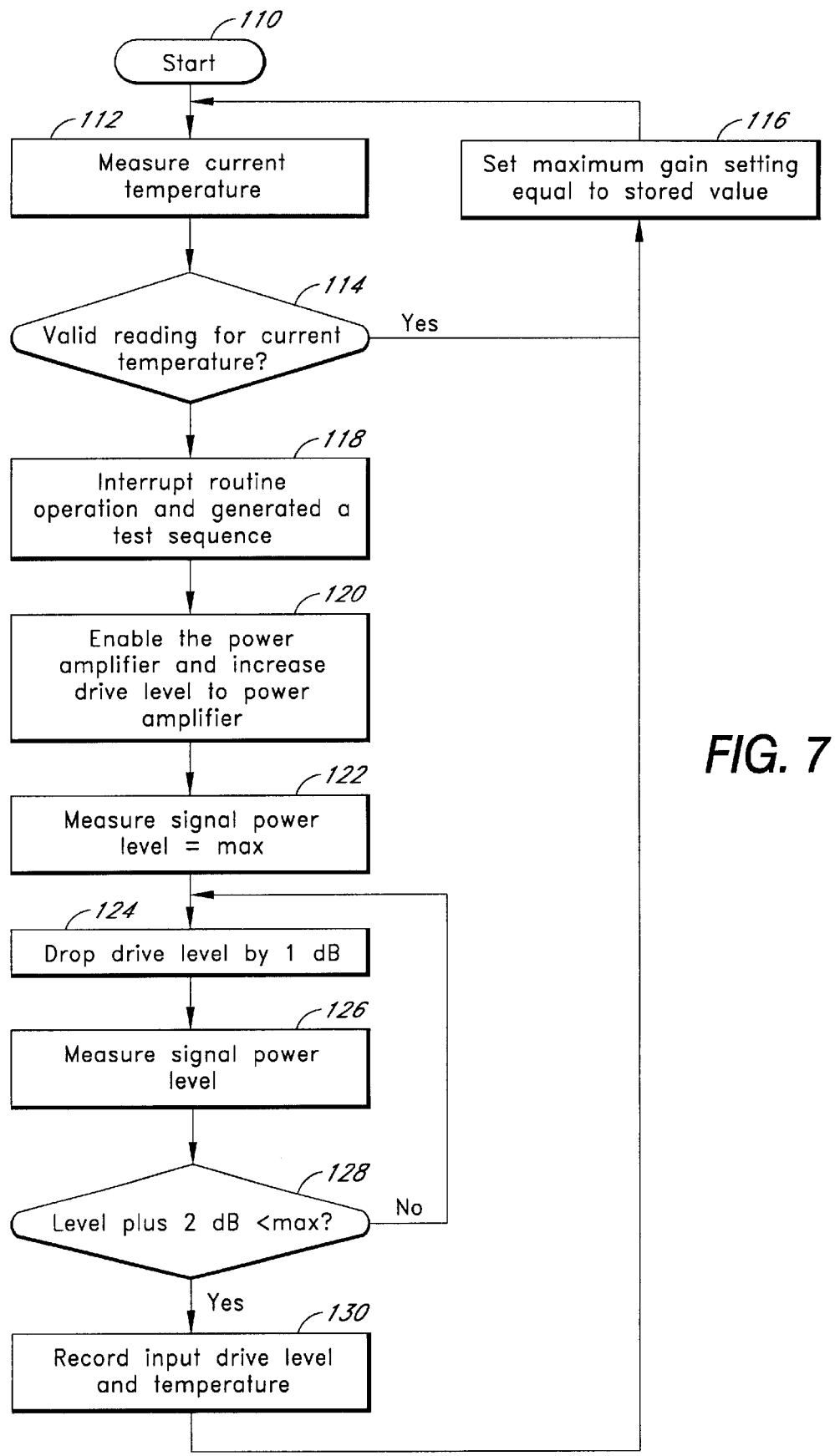
FIG. 7 is a flow chart showing the process for calibration of transmission circuitry of an installed communication unit during routine operation.

FIG. 7 is a flow chart showing calibration of transmission circuitry of an installed communication unit during routine operation. Flow begins in start block 110. In block 112, the outdoor unit 68 measures the current temperature using the temperature sensor 88. The microprocessor 86 converts the analog level to a digital value and forwards it to the indoor unit controller 96. In block 114, the indoor unit controller 98 compares the temperature to a table of temperatures stored in the memory unit 100. If there is a valid maximum gain setting for this temperature stored in the memory unit 100, the indoor unit controller 98 uses the stored maximum gain setting in block 116 and flow continues back to block 112. If there is no valid maximum gain setting for the current temperature, flow continues in block 118. In block 118, the indoor unit controller 98 interrupts routine operation and commands the signal generation unit 94 to generate a test sequence, thus, initiating the calibration sequence. In block 120, the indoor unit controller 98 enables the power amplifier 82 and increases the gain setting of the variable gain amplifier 96 so that it produces a signal power level large enough to drive the power amplifier 82 deep into saturation. For example, referring again to FIG. 4, the drive level to the power amplifier 82 exceeds −16 dBm such that both low performance and high performance parts are driven deep into saturation.

In block 122, the detector 84 measures the signal power level output by the power amplifier 82. The microprocessor 86 converts the analog detector value into a digital value and, then, passes it to the indoor unit controller 98. In block 124, the indoor unit controller 98 decreases the gain setting of the variable gain amplifier 96 so that its output signal power level is decreased by some incremental amount. For example, the indoor unit controller 98 decreases the gain setting of the variable gain amplifier 96 to drop its output signal power level by approximately 1 dB. In block 126, the detector 84 once again measures the output signal power level from the power amplifier 82. Once again, the microprocessor 86 digitizes the analog detector value and passes the value to the indoor unit controller 98. In block 128, the indoor unit controller 98 compares the detected current signal power level to the saturated signal power level in block 128. If the current level is approximately equal to the saturated level, flow continues back to block 124. For example, if the current level plus two decibels is greater than the saturated level, flow continues back to block 124 and the signal power level produced by the variable gain amplifier 96 is further decreased. If the current value is less than the saturated level by some incremental amount, flow continues to block 130. In block 130 in the indoor unit controller 98 stores the current temperature and the current gain setting of the variable gain amplifier 96 in the memory unit 100. The stored value becomes the maximum gain setting corresponding to the current operating conditions.

In one embodiment, the steps shown in FIG. 7 and described generally above are implemented in a series of processing units which are embodied in memory or custom application specific integrated circuits (ASIC) or executed by a microprocessor. In another embodiment, the steps are implemented in software and executed, for example, by a digital signal processor (DSP) or embodied in hardware in a field programmable gate array (FPGA) or in an ASIC.

In order to implement the steps shown in FIG. 7, the variable gain amplifier 96 should be designed with enough gain "headroom" so that the variable gain amplifier 96 continues to linearly increase the driving signal level as the power amplifier 82 enters saturation. Likewise, the detector 84 must have enough power handling capacity and linearity to provide accurate measurements as the power amplifier 82 enters saturation.

Operation according to FIG. 7 illustrates a specific implementation of the general principles of the invention. When an installed unit is operating in the field, routine operation is interrupted to enter a calibration mode. In a TDMA system, calibration mode can be entered between transmission slots. In a TDMA, FDMA or CDMA or other type of system, calibration mode can be entered during a natural period of idleness which occurs between the transmission bursts. If the length of the period of idleness does not allow sufficient time for the calibration to be completed, the calibration process can be executed over a series of disjoint periods of calibration. Alternatively, transmission of data can be interrupted or suspended in order to accommodate the calibration process. In one embodiment, the remote unit continues to receive data from the wireless link during calibration mode.

In calibration mode, the compression point of a circuit element is determined by applying a series of different drive levels to the circuit element. Based upon the determination of the compression point, a maximum transmission point is selected for the remote unit. Upon resumption of normal operation, the remote unit uses the maximum transmission point to limit the signal power level transmitted over the wireless link. As time passes or operating conditions change, the calibration process is re-executed.

Referring again to FIG. 4, several advantages of operation according to FIG. 7 become more readily apparent. When the power amplifier drive level is increased in block 120, if the power amplifier 82 has the characteristics shown by curve 64, the detected signal power level is approximately 36.25 dBm. If the power amplifier 82 has the characteristics shown by curve 32 or curve 60, the detector signal power level measures approximately 34.25 or 32.25 dBm, respectively. When the drive level is decreased from −16 dBm to −17 dBm in block 124, the signal power level detected by the detector remains fairly constant for all three curve characteristics. Likewise, at −18 dBm, the signal power level remains fairly constant for all three curve characteristics. However, as the input power drops to −19 dBm, the signal power level of an amplifier with the characteristics of curve 64 begins to decrease. At −20 dBm, the signal power level of an amplifier with the characteristics of curve 64 has dropped almost 1 decibel below the saturated level. At −20 dBm, the signal power level of a power amplifier with the characteristics of curve 32 has just begun to decrease from the saturated level. However, at −20 dBm, the signal power level produced by a power amplifier with the characteristics of the curve 60 remains nearly equal to the saturated level. At −21 dBm of input power, the signal power level of an amplifier with the characteristics of curve 64 has fallen 2 dB below the saturated value. As such, the gain setting of the variable gain amplifier 96 is recorded as the maximum gain setting. In a like manner, as the input drive level is further decreased, the signal power level output by amplifiers with the characteristics of curve 32 and 60 also begins to fall. The maximum gain setting corresponding to curve 32 is approximately equal to −23 dBm and the maximum gain setting corresponding to curve 60 is approximately −24 dBm. In this way, each power amplifier can be used in accordance with its capabilities.

In certain embodiments, it is advantageous to increase or decrease the step size by which the drive level is incremented such that it is more or less than 1 dB. In addition, in certain embodiments, it is advantageous to increase or decrease the amount by which the signal power level of the power amplifier must drop in order to determine the maximum gain setting such that it is more or less than 2 dB. Several factors can be used to determine the optimal value of these two variables. As shown in FIG. 6, the detector 84 does not have a perfectly linear response. In addition, the analog-to-digital converter within the microprocessor 86 introduces quantization errors when it converts the analog signal level to digital value. Therefore, some error is introduced by the accuracy with which the detector 84 measures the signal power level. In addition, the response of the variable gain amplifier 96 to changes in the gain setting is not perfectly linear and also introduces some error into the measurement. Therefore, it is advantageous to include some additional margin to compensate for any errors introduced by these factors.

One advantage of operation according to the process of FIG. 7 is that it is not necessary that the detector make an accurate and absolute determination of the signal power level output by the amplifier. It is only necessary that the detector measures a relative change in the output power. Likewise, the signal power level at which the variable gain amplifier 96 produces the IF drive signal need not be absolute. It is only necessary that the variable gain amplifier 96 output power change relative to the previous output level in response to the changing gain settings.

In one embodiment, additional factors which influence the outdoor unit characteristics are stored in the memory unit 100 in order to more precisely identify the current operating conditions. For example, if the outdoor unit is capable of operation in several frequency bands, in one embodiment, the data stored in the memory unit 100 is a function of both temperature and frequency or frequency band. The identification number of the outdoor unit is also stored in the memory unit 100. If a new outdoor unit is connected to the indoor unit, the calibration points must be retaken using the new outdoor unit. Other factors which can be considered in determining the current operating conditions are indoor unit temperature, the satellite or satellite position, the presence of rain or other environmental conditions or the rate of change of the temperature.

Figure 8:
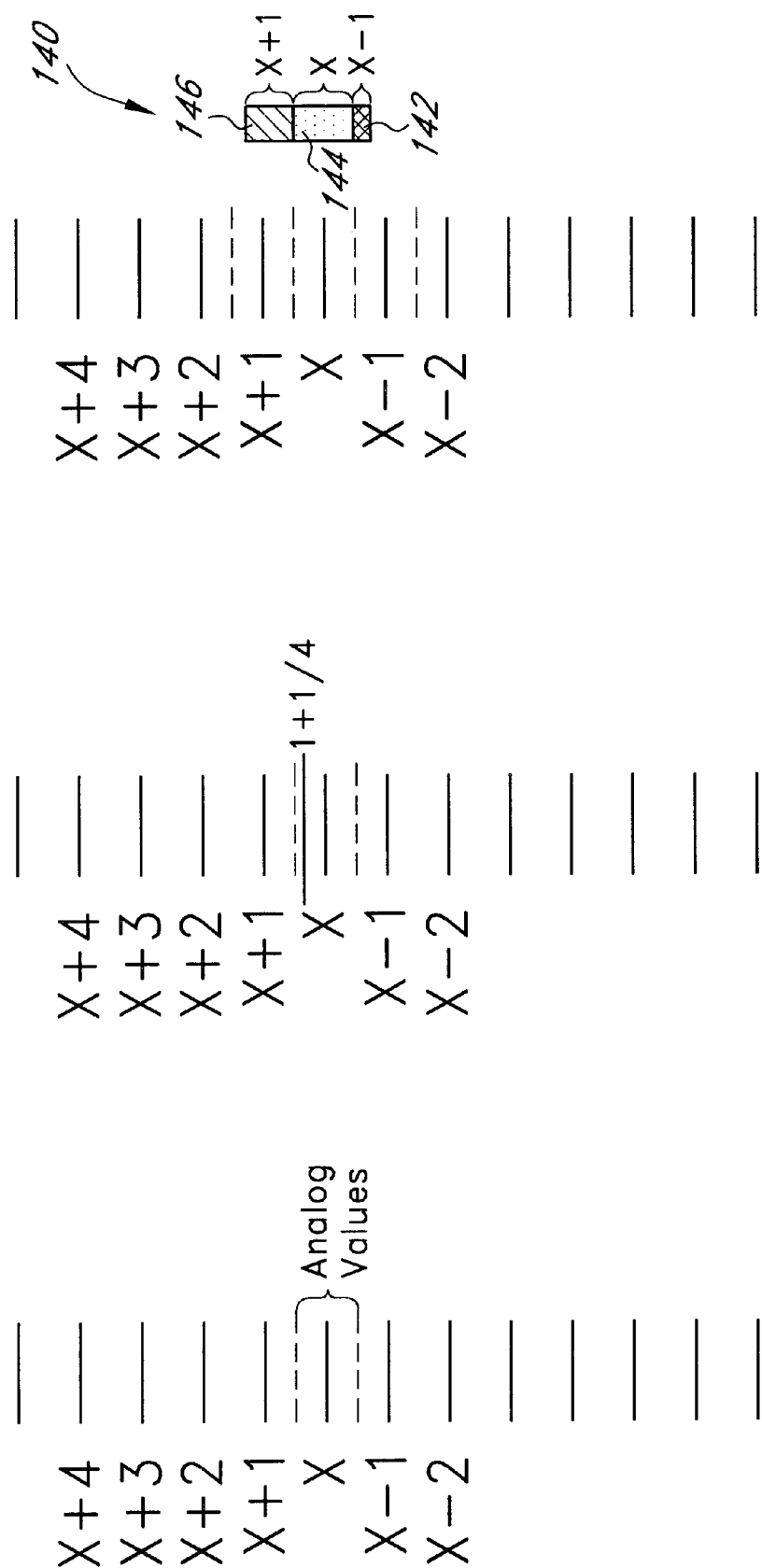
FIGS. 8A, 8B, and 8C are representational drawings illustrating the advantages that can be gained through transmission of a modulated signal.

FIG. 8 is a representational drawing illustrating the advantages that can be gained through transmission of a modulated signal. If a constant wave (CW) signal is output from the power amplifier 82, the detector 84 produces a single analog value representative of the signal power level. The analog-to-digital converter within the microprocessor 86 converts the analog detector output to the closest digital value. For example, in FIG. 8A, a range of analog detector output voltages surrounding the level x is indicated. Any detector output within this range generates a digital value of x at the output of the analog-to-digital converter. Essentially, any analog value between x−½ and x+½ maps into a value of x at the output of the analog-to-digital converter. For example, as shown in FIG. 8B, if the detector output is x+¼, the output of the analog-to-digital converter is x. Error introduced in this manner is referred to as quantization error.

However, if a modulated signal is output from the power amplifier 82, the signal power level produced by the amplifier varies over time due to the modulation. For example, in a simple scenario, the modulated signal power level varies evenly plus or minus one step size due to the modulation. If a series of analog detector level values are input to the analog-to-digital converter, a variety of corresponding digital values are produced. FIG. 8C illustrates a conversion of a modulated signal. Block 140 represents an even distribution of signal power levels produced by the power amplifier 82 centered about a value of x+¼ and fanning a range of plus or minus one analog-to-digital converter step size. Those detector level values which fall in the region below x−½ as shown by the shaded region 142 map into a value of x−1. Those detector level values which are between x−½ and x+½ map into the value x as shown by shaded region 144. Those detector level values which are between x+½ and x+1¼ map into x+1 as shown by shaded region 146. As can be seen by examination of the relative size of areas 142, 144 and 146, ⅛ of the samples produce a value of x−1, one half of the samples produce a value of x, and ⅜ samples produce a value of x+1. The average of these values is x+¼ which accurately reflects the average value of the signal power level. The same effect is achieved by use of other distributions, such as a Gaussian distribution, of the signal power level. Thus, by sending a modulated signal and averaging a set of converted detector level samples, a more accurate estimation of the actual signal power level can be determined, thus, lessening the error caused by quantization of the analog detector level output.

In one embodiment, the remote units communicate with the hub station over the reverse link using a set of random access channels. For example, in one embodiment, the reverse link operates in accordance with assignee's co-pending application entitled METHOD AND APPARATUS FOR MULTIPLE ACCESS IN A COMMUNICATION SYSTEM, application Ser. No. 09/407,639, filed concurrently herewith, the entirety of which is hereby incorporated by reference.

Figure 9:
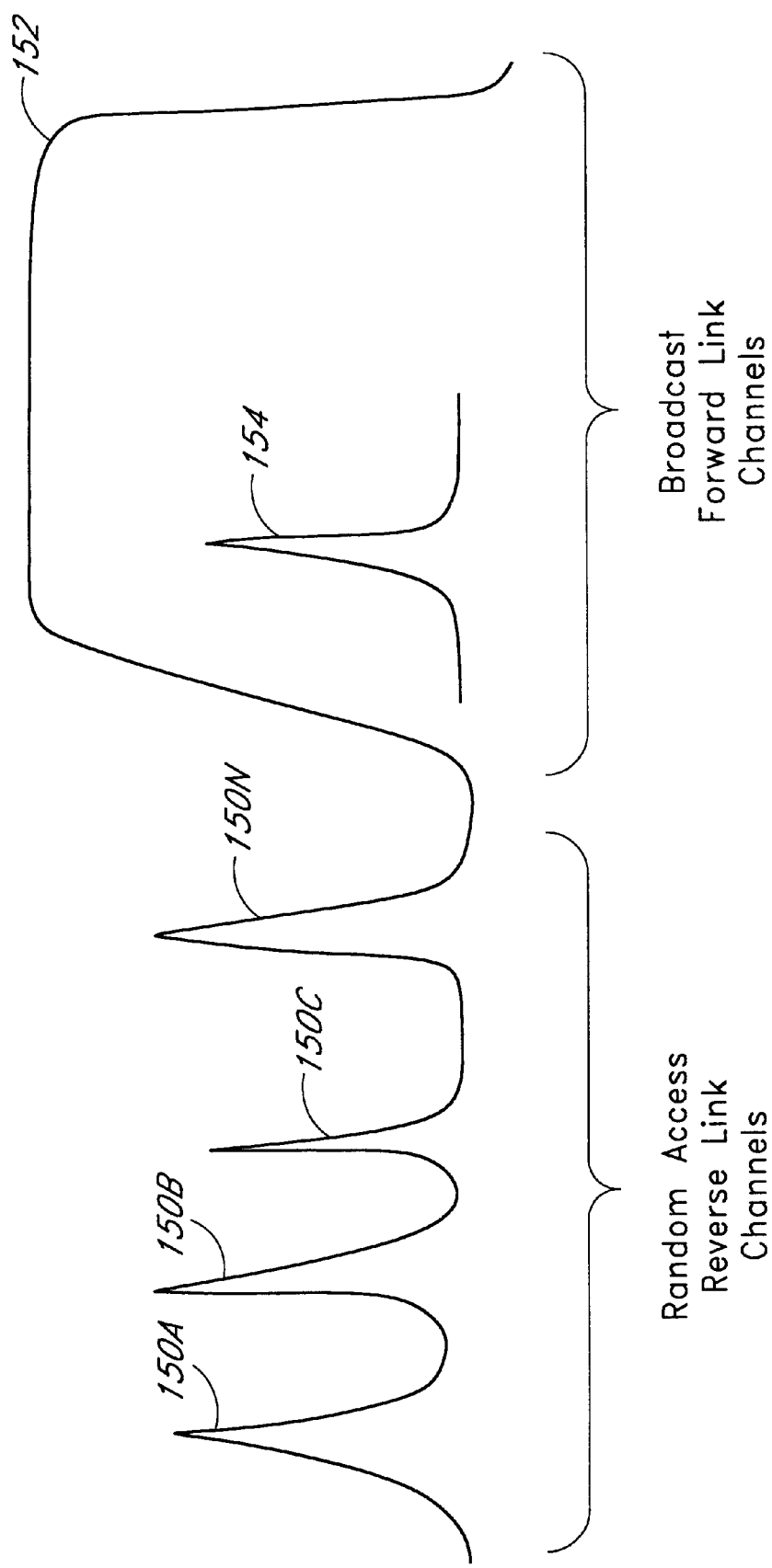
FIG. 9 is a spectral plot showing a random access reverse link channel and a broadcast forward link channel.

In contrast, the hub station communicates with the remote units on a broadcast channel. FIG. 9 is a spectral plot showing a random access reverse link channel and a broadcast forward link channel. The random access reverse link channels 150A–150N, each originating from a different remote unit, randomly block one another in the natural course of system operation. However, the broadcast forward link channel 152 can be designed so that they do not block one another and, therefore, are more tolerant of additional interference. In addition, the forward link signals are typically sent at a higher power rate than the reverse link signals.

The random access reverse link channels are typically transmitted about 10 dB lower power spectral density than the broadcast forward link channel. The hub station has a significantly larger antenna than the remote units and, therefore, it is able to detect the reverse link signal at a smaller power spectral density. Therefore, in one embodiment, when the calibration process is executed by the remote unit, the transmit frequency of the outdoor unit is changed so that the calibration output 154 falls within the forward link channel bandwidth. In this way, interference with the more susceptible random access reverse link channels 150A–150N is avoided. In order to provide minimum interference to the broadcast forward link channel 152, it is advantageous to modulate the calibration output 154 transmission rather than to transmit a constant waveform (CW). By modulating the calibration output 154 transmission, the energy transmitted into the forward link channel 152 is spread over a range of frequencies and, therefore, the system is not burden with a strong, single tone signal.

In another embodiment, the output of the amplifier 82 during the calibration process is dumped into a dummy load so that a majority of the energy output by the power amplifier 82 is not transmitted over the wireless link. In yet another embodiment, the remote unit transmits within the random access reverse link channels during the calibration process. In another embodiment, the remote unit continues to transmit user data during the calibration process rather than a dummy sequence.

In the embodiment shown in FIG. 7, the calibration process is triggered by changes in the operating temperature of the outdoor unit 68. The calibration values remain stored in the memory unit 100 and available for use should conditions return to a previously calibrated state. In one embodiment, each calibration entry in the memory unit 100 is time-stamped and expires after a predetermined duration. After a set of stored values expires, the corresponding operating state characteristics are re-calibrated the next time such conditions exist.

In an alternative embodiment, the current characteristics of the power amplifier are calibrated intermittently. In one embodiment, for example, the characteristics of the power amplifier is calibrated every eight minutes. The indoor unit uses the most recently collected data until the next calibration data is collected. This embodiment has the advantage of eliminating use of the temperature sensor. However, this embodiment requires more frequent calibration and is less accurate during periods of rapid temperature change.

The invention has been described herein with reference to a satellite system. The same techniques can be applied to other operating environments. For example, the invention can be implemented in a cellular or other terrestrial wireless communication system—either in the base station or remote unit. The invention can be implemented in systems which communicate using a variety of modulation and access techniques. For example, the invention may be implemented in a FDMA, CDMA or TDMA type system. Likewise, the description above was presented with reference to a power amplifier. However, the teachings can be directly applied to calibrate of other types of circuit elements (such as mixers) or a set of circuit elements whether they exhibit class A, class AB, class B or other operating characteristics.

In one embodiment, when the maximum gain setting for the current operating conditions is achieved, another mechanism is used to increase the signal level with which the signal reaches the hub station. For example, in one embodiment, when the maximum gain setting is reached, the indoor unit controller 98 commands the signal generation unit 94 to forward a message to the hub station indicating that subsequent remote unit transmissions will have a decreased data rate. By reducing the data rate in half, the energy devoted to each information bit is doubled if the transmission power remains constant. If the hub station once again requests an increase in the transmission power, the data rate can be further reduced. As link conditions improve and the hub station requests that the remote unit decrease the power at which it is transmitting, the indoor unit 98 commands the signal generation unit 94 to generate a message for the hub station indicating that subsequent transmissions from the remote unit will have an increased data rate.

In the method of FIG. 7, the compression point of the power amplifier 82 is determined by initially driving the power amplifier into saturation and, then, incrementally dropping the input drive level until the amplifier comes out of saturation. In another embodiment, the 1 dB compression point is determined by incrementally increasing the drive level and detecting a decrease in the gain of the power amplifier 92 as it enters saturation. For example, in such an embodiment, to determine the 1 dB compression point of a power amplifier having the characteristics shown in FIG. 4, initially, the power amplifier is driven at −26 dBm. A corresponding measurement is taken by the detector 84. The indoor unit controller 98 commands the variable gain amplifier 86 to increase its gain by approximately 1 dB. Again, the detector 84 is used to make a measurement of the output power. The 1 dB compression point of the power amplifier 82 is determined when the measured signal power level indicates that the gain of the power amplifier 82 has fallen by 1 dB in comparison to the first measurement which is taken.

This process has different requirements than the process shown in FIG. 7. For example, notice that the detector curve shown in FIG. 6 is not linear. Therefore, as the detector 84 attempts to measure the signal power level output by the amplifier 82, some variation in the measurements is due to errors introduced by the detector 84. In addition, the variable gain amplifier 96 also has a non-linear response which further adds to the measurement errors. This type of measurement requires a larger range of detector values as well as a larger range of drive level values which causes a corresponding increase in measurement errors due to non-linearities or an increase in on the performance requirements of these elements.

In contrast, the method of FIG. 7 requires the use of the detector over only a relatively small range of power levels, thus, decreasing the impact of the non-linearities on the measurements. In addition, because the range of detected signal power levels is decreased, the range over which the analog-to-digital converter produces corresponding digital values is also decreased. For this reason, each step of the analog-to-digital converter output corresponds to a smaller change in signal power level, therefore, increasing the accuracy with which the signal power level is measured.

The invention introduces a number of benefits into the system. For example, the modular nature of the indoor unit and the outdoor unit allow them to be separately built, tested and calibrated and also separately serviced and replaced in the field. However, it is not necessary that the invention be embodied in two separate units. The advantages of the invention will also benefit a system which is housed in a single body.

The calibration of the installed system at the current operating conditions in the midst of routine operation has several advantages. For example, each unit takes advantage of its full operating capabilities at the current operating conditions. The system does not require the measurement of an absolute signal power level which can be difficult and inaccurate. The invention allows certain changes to be automatically compensated for in the field. For example, if the length of cable which connects the indoor and outdoor units is increased in length, the insertion loss of the cable typically increases. Such changes are automatically accounted for during the next calibration process.

The invention also has advantages in comparison with factory calibration. Factory calibration only calibrates for conditions as they exist in the calibration test set up. Such testing requires the fixed mating of indoor and outdoor units as well as the cables which connect them. Although factory calibration can be conducted over a variety of temperatures and frequencies, factory testing does not account for aging. In addition, factory testing does not account for environmental factors to which the unit may be subjected. For example, the impedance match between the outdoor unit and the satellite dish to which it is connected can affect the signal power level produced by the outdoor units. It is typically not practical to factory test a unit in conjunction with a satellite dish with which it is permanent coupled.

Figure 10:
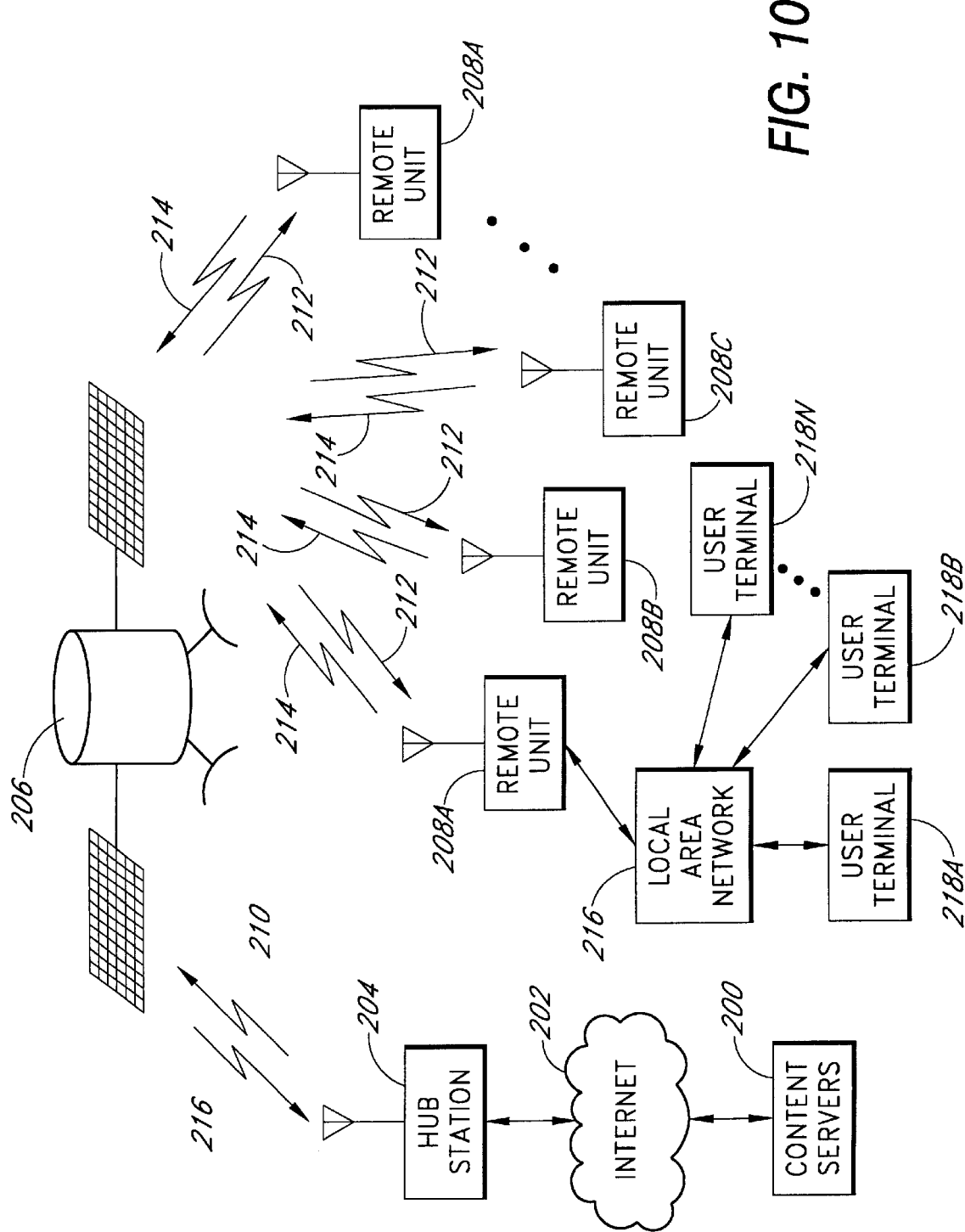
FIG. 10 is a block diagram illustrating an exemplifying system in which the invention may be embodied.

Although the invention can be used in many systems, FIG. 10 is a block diagram illustrating an exemplifying system in which the invention may be embodied. The system in FIG. 10 provides high-speed, reliable Internet communication service over a satellite link.

In particular, in FIG. 10, content servers 200 are coupled to the Internet 202 which is in turn coupled to a hub station 204 such that the hub station 204 can request and receive digital data from the content servers 200. The hub station 204 also communicates via satellite 206 with a plurality of remote units 208A–208N. For example, the hub station 204 transmits signals over a forward uplink 210 to the satellite 206. The satellite 206 receives the signals from the forward uplink 210 and re-transmits them on a forward downlink 212. Together, the forward uplink 210 and the forward downlink 212 are referred to as the forward link. The remote units 208A–208N monitor one or more channels which comprise the forward link in order to receive remote-unit-specific and broadcast messages from the hub station 204.

In a similar manner, the remote units 208A–208N transmit signals over a reverse uplink 214 to the satellite 206. The satellite 206 receives the signals from the reverse uplink 214 and re-transmits them on a reverse downlink 216. Together, the reverse uplink 214 and the reverse downlink 216 are referred to as the reverse link. The hub station 204 monitors one or more channels which comprise the reverse link in order to extract messages from the remote units 208A–208N. For example, in one embodiment of the exemplifying system, the reverse link carries multiple access channels in accordance with assignee's above referenced co-pending application Ser. No. 09/467,639 [Attorney Docket No. TACHYON.018CP2].

In one embodiment of the exemplifying system, each remote unit 208A–208N is coupled to a plurality of system users. For example, in FIG. 10, the remote unit 208A is shown as coupled to a local area network 216 which in turn is coupled to a group of user terminals 218A–218N. The user terminals 218A–218N may be one of many types of local area network nodes such as a personal or network computer, a printer, digital meter reading equipment or the like. When a message is received over the forward link intended for one of the user terminals 218A–218N, the remote unit 208A forwards it to the appropriate user terminal 218 over the local area network 216. Likewise, the user terminals 218A–218N can transmit messages to the remote unit 208A over the local area network 216.

In one embodiment of the exemplifying system, the remote units 208A–208N provide Internet service to a plurality of users. For example, assume that the user terminal 218A is a personal computer which executes browser software in order to access the World Wide Web. When the browser receives a request for a web page or embedded object from the user, the user terminal 218A creates a request message according to well-known techniques. The user terminal 218A forwards the request message over the local area network 216 to the remote unit 208A, also using well-known techniques. Based upon the request message, the remote unit 208A creates and transmits a wireless link request over a channel within the reverse uplink 214 and the reverse downlink 216. The hub station 204 receives the wireless link request over the reverse link. Based upon the wireless link request, the hub station 204 passes a request message to the appropriate content server 200 over the Internet 202.

In response, the content server 200 forwards the requested page or object to the hub station 204 over the Internet 202. The hub station 204 receives the requested page or object and creates a wireless link response. The hub station transmits the wireless link response over a channel within the forward uplink 210 and forward downlink 212. For example, in one embodiment of the exemplifying system, the hub station 204 operates in accordance with assignee's co-pending application entitled TRANSMISSION OF TCP/IP DATA OVER A WIRELESS COMMUNICATION CHANNEL, application Ser. No. 09/407,646 [Attorney Docket No. TACHYON.046A], and assignee's co-pending application entitled METHOD AND SYSTEM FOR FREQUENCY SPECTRUM RESOURCE ALLOCATION, Ser. No. 09/407,645 [Attorney Docket No. TACHYON.039A], each of which is filed concurrently herewith and the entirety of which is hereby incorporated by reference. In one embodiment, the invention is used to determine the assigned data rate as described in the just-mentioned patent application.

The remote unit 208A receives the wireless link response and forwards a corresponding response message to the user terminal 218A over the local area network 216. In one embodiment of the exemplifying system, the process of retrieving a web page or object is executed in accordance with assignee's co-pending application entitled DISTRIBUTED SYSTEM AND METHOD FOR PREFETCHING OBJECTS, application Ser. No. 09/129,142 [Attorney Docket No. TACHYON.001A2], filed Aug. 5, 1998, the entirety of which is hereby incorporated by reference. In this way, a bidirectional link between the user terminal 218A and the content servers 200 is established.

In view of the description above, a myriad of alternative embodiments will be readily apparent to one skilled in the art. For example, the analog detector may be replaced with a detector which produces a digital output indication. In addition, the temperature sensor may also be replaced with a sensor which produces a digital output indication. In such a case, in one embodiment, these elements are coupled directly to the indoor unit controller. In yet another embodiment, gain variation is achieved through the use of a variable attenuator which can be located in either the indoor unit or the outdoor unit.

The invention may be embodied in other specific forms without departing from its spirit or essential characteristics. The described embodiment is to be considered in all respects only as illustrative and not restrictive and the scope of the invention is, therefore, indicated by the appended claims rather than by the foregoing description. All changes which come within the meaning and range of equivalency of the claims are to be embraced within their scope.

What is claimed is:

1. An installed communication unit, comprising:

a first unit comprising:
   a power amplifier configured to receive a driving signal and producing a transmission signal;
   a power detector coupled to said power amplifier so as to receive said transmission signal and producing an indication of a signal power level of said transmission signal;
   a microprocessor coupled to said power detector so as to receive said indication produced by said power detector and configured to produce a corresponding digital data output value; and a second unit comprising:
   a variable gain amplifier having a gain setting input coupled to said power amplifier and producing said driving signal;
   a controller coupled to said microprocessor and coupled to said gain setting input, said controller configured to interrupt routine operation to determine a maximum value for said gain setting input corresponding to a compression point of said power amplifier at current operating conditions by increasing a value of said gain setting input such that said driving signal is of sufficient amplitude to drive said power amplifier into compression, recording a first corresponding digital data output value and decreasing said value of said gain setting input until a second corresponding digital data value falls below said first corresponding digital data value by a predetermined amount; and
   a memory coupled to said controller and storing said maximum value.

2. A method of calibrating transmission circuitry of an installed communication unit, comprising the steps of:

interrupting routine operation;

generating a driving signal at a first level which drives a circuit element into saturation;

measuring a first signal power level produced by said circuit element;

setting said level of said driving signal to a second level that is lower than said first driving signal level;

measuring a second signal power level produced by said circuit element;

comparing said first signal power level to said second signal power level;

if said second signal power level is less than said first signal power level by more than a predetermined amount, using said second driving signal level as a maximum drive level for said circuit element upon resuming routine operation;

measuring a temperature at which said circuit element is operating; and executing said step of interrupting routine operation in response to a change in said temperature.

3. A method of calibrating transmission circuitry of an installed communication unit, comprising the steps of:

interrupting routine operation;

generating a driving signal at a first level which drives a circuit element into saturation;

measuring a first signal power level produced by said circuit element;

setting said level of said driving signal to a second level that is lower than said first driving signal level;

measuring a second signal power level produced by said circuit element;

comparing said first signal power level to said second signal power level;

if said second signal power level is less than said first signal power level by more than a predetermined amount, using said second driving signal level as a maximum drive level for said circuit element upon resuming routine operation;

measuring current conditions at which said circuit element is operating;

comparing said current conditions to a list of previously stored maximum drive levels and corresponding operating conditions; and executing said step of interrupting routine operation if no previously stored maximum drive level listing is available for said current conditions.

4. A method of calibrating transmission circuitry of an installed communication unit, comprising the steps of:

interrupting routine operation;

generating a driving signal at a first level which drives a circuit element into saturation;

measuring a first signal power level produced by said circuit element by
generating said driving signal such that an amplitude of said driving signal varies over time;
converting a series of analog values, each corresponding to an instantaneous signal power level produced by said circuit element, into a set of digital values; and
averaging said set of digital values to determine said first signal power level;

setting said level of said driving signal to a second level that is lower than said first driving signal level;

measuring a second signal power level produced by said circuit element;

comparing said first signal power level to said second signal power level; and if said second signal power level is less than said first signal power level by more than a predetermined amount, using said second driving signal level as a maximum drive level for said circuit element upon resuming routine operation.

5. A method of calibrating transmission circuitry of an installed communication unit, comprising the steps of:

interrupting routine operation;

generating a driving signal at a first level which drives a circuit element into saturation;

measuring a first signal power level produced by said circuit element;

setting said level of said driving signal to a second level that is lower than said first driving signal level;

measuring a second signal power level produced by said circuit element;

comparing said first signal power level to said second signal power level;

if said second signal power level is less than said first signal power level by more than a predetermined amount, using said second driving signal level as a maximum drive level for said circuit element upon resuming routine operation;

resuming routine operation;

receiving a command from a hub station to increase a signal power level at which said circuit element produces a signal;

increasing the level of said driving signal if said level is less than said maximum drive level; and decreasing a data rate at which data is transmitted if said level of said driving signal is greater than or equal to said maximum drive level.

6. An apparatus for calibrating transmission circuitry of an installed communication unit, comprising:

means for interrupting routine operation;

means for generating a driving signal at a first level which drives a circuit element into saturation;

means for measuring a first signal power level produced by said circuit element;

means for setting said level of said driving signal to a second level that is lower than said first driving signal level;

means for measuring a second signal power level produced by said circuit element;

means for comparing said first signal power level to said second signal power level, and, if said second signal power level is less than said first signal power level by more than a predetermined amount, using said lower value as a maximum drive level for said circuit element upon resuming routine operation; and means for measuring a temperature at which said circuit element is operating and interrupting routine operation in response to a change in said temperature.

7. An apparatus for calibrating transmission circuitry of an installed communication unit, comprising:

means for interrupting routine operation;

means for generating a driving signal at a first level which drives a circuit element into saturation;

means for measuring a first signal power level produced by said circuit element;

means for setting said level of said driving signal to a second level that is lower than said first driving signal level;

means for measuring a second signal power level produced by said circuit element; and means for comparing said first signal power level to said second signal power level, and, if said second signal power level is less than said first signal power level by more than a predetermined amount, using said lower value as a maximum drive level for said circuit element upon resuming routine operation;

means for measuring current conditions at which said circuit element is operating; and means for comparing said current conditions to a list of previously stored maximum drive levels and corresponding operating conditions and activating said means for interrupting routine operation if no previously stored maximum drive level listing is available for said current conditions.

8. An apparatus for calibrating transmission circuitry of an installed communication unit, comprising:

means for interrupting routine operation;

means for generating a driving signal at a first level which drives a circuit element into saturation;

means for measuring a first signal power level produced by said circuit element, including
means for generating said driving signal such that an amplitude of said driving signal varies over time;
means for converting a series of analog values, each corresponding to an instantaneous signal power level produced by said circuit element, into a set of digital values; and means for averaging said set of digital values to determine said first signal power level;

means for setting said level of said driving signal to a second level that is lower than said first driving signal level;

means for measuring a second signal power level produced by said circuit element; and means for comparing said first signal power level to said second signal power level, and, if said second signal power level is less than said first signal power level by more than a predetermined amount, using said lower value as a maximum drive level for said circuit element upon resuming routine operation.

9. An apparatus for calibrating transmission circuitry of an installed communication unit, comprising:

means for interrupting routine operation;

means for generating a driving signal at a first level which drives a circuit element into saturation;

means for measuring a first signal power level produced by said circuit element;

means for setting said level of said driving signal to a second level that is lower than said first driving signal level;

means for measuring a second signal power level produced by said circuit element;

means for comparing said first signal power level to said second signal power level, and, if said second signal power level is less than said first signal power level by more than a predetermined amount, using said lower value as a maximum drive level for said circuit element upon resuming routine operation;

means for receiving a command from a hub station to increase a signal power level at which said circuit element produces a signal upon resuming routine operation; and means for increasing a level of said driving signal if said level is less than said maximum drive level, and decreasing a data rate at which data is transmitted if said signal level is greater than or equal to said maximum drive level.

10. A method of limiting the output power of a wireless unit, comprising the steps of:

interruptions routine operation of an installed communication unit;

selecting a maximum transmission point for said installed communication unit by applying a series of different drive levels to a circuit element within the installed communication unit to determine a compression point of the circuit element;

resuming routine operation using said maximum transmission point to limit a transmission power of said installed communication unit measuring current conditions at which said installed communication unit is operating;

comparing said current conditions to a list of previously stored maximum transmission points and corresponding operating conditions; and executing said step of interrupting routine operation if no previously stored maximum transmission point listing is available for said current conditions.

\* \* \* \* \*